(12) United States Patent
Radic

(10) Patent No.: US 10,734,909 B2
(45) Date of Patent: *Aug. 4, 2020

(54) POWER CONVERTER WITH ACTIVE CLAMP

(71) Applicant: Appulse Power Inc., Toronto, OT (CA)

(72) Inventor: Aleksandar Radic, Toronto (CA)

(73) Assignee: Appulse Power Inc., Toronto (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/569,924

(22) Filed: Sep. 13, 2019

(65) Prior Publication Data

US 2020/0007048 A1    Jan. 2, 2020

Related U.S. Application Data

(63) Continuation of application No. 16/221,945, filed on Dec. 17, 2018, now Pat. No. 10,418,912.

(Continued)

(51) Int. Cl.
*H02M 3/335* (2006.01)
*H02M 1/34* (2007.01)

(52) U.S. Cl.
CPC ......... *H02M 3/33592* (2013.01); *H02M 1/34* (2013.01); *H02M 2001/342* (2013.01)

(58) Field of Classification Search
CPC ..... H02M 2001/342; H02M 2001/344; H02M 2001/0048; H02M 1/34; H02M 3/335;

(Continued)

(56) References Cited

U.S. PATENT DOCUMENTS

| 5,455,757 A | 10/1995 | Nguyen et al. |
| 5,796,595 A | 8/1998 | Cross |

(Continued)

FOREIGN PATENT DOCUMENTS

| CN | 102208873 A | 10/2011 |
| CN | 108683336 A | 10/2018 |

(Continued)

OTHER PUBLICATIONS

International Search Report dated Apr. 26, 2019 for PCT Patent Application No. PCT/IB2018/060252.

(Continued)

*Primary Examiner* — Yusef A Ahmed
*Assistant Examiner* — Shahzeb K Ahmad
(74) *Attorney, Agent, or Firm* — MLO, a professional corp.

(57) ABSTRACT

A power converter includes an input side to receive an input voltage, and an output side to provide an output voltage, a main switch, a controller, a transformer having a primary winding that couples the main switch to the input side, an active clamp switch coupled to the input side by an active clamp capacitor, and an active clamp controller circuit. The active clamp controller circuit includes a sampling circuit to generate a sampled main switch voltage, a delay circuit to generate a delayed sampled main switch voltage, a voltage comparison circuit, and an active clamp switch controller circuit configured to i) enable the active clamp switch based on a first comparison between the sampled main switch voltage and the delayed sampled main switch voltage, and ii) disable the active clamp switch based on a second comparison between the sampled main switch voltage and the delayed sampled main switch voltage.

20 Claims, 8 Drawing Sheets

Related U.S. Application Data

(60) Provisional application No. 62/609,033, filed on Dec. 21, 2017.

(58) Field of Classification Search
CPC ......... H02M 3/33576; H02M 3/33569; H02M 3/33592
See application file for complete search history.

(56) References Cited

U.S. PATENT DOCUMENTS

| | | | |
|---|---|---|---|
| 6,069,803 | A | 5/2000 | Cross |
| 6,452,818 | B1 | 9/2002 | Simopoulos |
| RE38,196 | E | 7/2003 | Vinciarelli et al. |
| 7,606,051 | B1 | 10/2009 | Wittenbreder |
| 9,246,391 | B2 | 1/2016 | Berghegger |
| 2003/0179592 | A1 | 9/2003 | Nishiyama et al. |
| 2005/0201128 | A1 | 9/2005 | Jin et al. |
| 2005/0285661 | A1 | 12/2005 | Wittenbreder |
| 2006/0013021 | A1 | 1/2006 | Aso |
| 2006/0062026 | A1 | 3/2006 | Wittenbreder |
| 2007/0195560 | A1 | 8/2007 | Yasumura |
| 2007/0263415 | A1 | 11/2007 | Jansen et al. |
| 2008/0123374 | A1 | 5/2008 | Vinciarelli |
| 2008/0315858 | A1 | 12/2008 | Hong et al. |
| 2009/0073725 | A1 | 3/2009 | Lin |
| 2011/0194313 | A1 | 8/2011 | Yoshinaga |
| 2014/0233275 | A1* | 8/2014 | Yang ................. H02M 3/33576 363/21.17 |
| 2014/0268914 | A1 | 9/2014 | Wang et al. |
| 2015/0003121 | A1 | 1/2015 | Yang et al. |
| 2015/0263639 | A1 | 9/2015 | Russell et al. |
| 2015/0318788 | A1 | 11/2015 | Kovacic et al. |
| 2015/0357904 | A1 | 12/2015 | Odell et al. |
| 2016/0072399 | A1 | 3/2016 | Kikuchi et al. |
| 2016/0099647 | A1 | 4/2016 | Zhang et al. |
| 2016/0226389 | A1 | 8/2016 | Quaglino et al. |
| 2016/0365801 | A1 | 12/2016 | Phadke |
| 2017/0070152 | A1 | 3/2017 | Liu |
| 2018/0115252 | A1 | 4/2018 | Chang et al. |
| 2018/0175725 | A1 | 6/2018 | Hu et al. |
| 2018/0226895 | A1 | 8/2018 | Song et al. |
| 2018/0254710 | A1 | 9/2018 | Wang et al. |
| 2018/0287481 | A1* | 10/2018 | Liu .................. H02M 1/38 |
| 2018/0294735 | A1* | 10/2018 | Song .................. H02M 1/083 |
| 2019/0044449 | A1 | 2/2019 | Li et al. |
| 2019/0044450 | A1 | 2/2019 | Muto et al. |
| 2019/0052174 | A1* | 2/2019 | Gong ................ H02M 3/33561 |
| 2019/0149052 | A1 | 5/2019 | Gong et al. |
| 2019/0149054 | A1 | 5/2019 | Shimura et al. |
| 2020/0007041 | A1 | 1/2020 | Liu et al. |

FOREIGN PATENT DOCUMENTS

| | | |
|---|---|---|
| JP | 2009290932 A | 12/2009 |
| KR | 20160125676 A | 11/2016 |
| KR | 20170106204 A | 9/2017 |
| WO | 2017095408 A1 | 6/2017 |

OTHER PUBLICATIONS

International Search Report dated May 31, 2019 for PCT Patent Application No. PCT/IB2019/050686.
Notice of Allowance dated Apr. 17, 2019 for U.S. Appl. No. 16/221,945.
Notice of Allowance dated Jul. 3, 2019 for U.S. Appl. No. 16/247,227.
Office Action dated Jul. 29, 2019 for U.S. Appl. No. 16/145,819.
Office Action dated May 31, 2019 for U.S. Appl. No. 16/247,227.
Notice of Allowance dated Feb. 7, 2020 for U.S. Appl. No. 16/401,980.
Notice of Allowance dated Mar. 6, 2020 for U.S. Appl. No. 16/145,819.
Office Action dated Oct. 3, 2019 for U.S. Appl. No. 16/401,980.

* cited by examiner

FIG. 7

700

↓

Receive an input voltage $V_{in}$ at a primary winding of a transformer of a power converter — 702

↓

Control a current through the primary winding using a main switch of the power converter — 704

↓

Sample a voltage $V_{dsM1}$ of the main switch to generate a voltage $V_{dsSmp}$ that is based on the main switch voltage $V_{dsM1}$ — 706

↓

Sample the input voltage $V_{in}$ to generate a threshold voltage $V_{dsThr}$ that is based on the input voltage $V_{in}$ — 708

↓

Compare the voltage $V_{dsSmp}$ to the threshold voltage $V_{dsThr}$ — 710

↓

◇ $V_{dsSmp} >= V_{dsThr}$ — 712

NO → back to 710
YES ↓

Clamp the main switch voltage $V_{dsM1}$ to a maximum voltage using an active clamp switch of an active clamp circuit and based on a comparison of $V_{dsSmp}$ to a delayed sampled main switch voltage $V_{dsSmpDel}$ — 714

POWER CONVERTER WITH ACTIVE CLAMP

RELATED APPLICATIONS

This application is a continuation of U.S. patent application Ser. No. 16/221,945, filed Dec. 17, 2018 and entitled "Power Converter with Active Clamp", which claims priority to U.S. Provisional Patent Application No. 62/609,033 filed on Dec. 21, 2017, and entitled "Integrated Adaptive Active Clamp," and is related to U.S. patent application Ser. No. 16/145,819, filed Sep. 28, 2018, and entitled "Integrated Self-Driven Active Clamp," all of which are hereby incorporated by reference for all purposes.

BACKGROUND

Switch-mode power supplies (SMPS) ("power converters") are power management components in modern electronic devices. They provide, among other things, efficient and galvanically isolated power to multiple loads. To achieve high power processing efficiency and/or galvanic isolation, conventionally one or more magnetically coupled elements, semiconductor switches and associated gate driver circuits are required.

Magnetically coupled elements of the power converter often suffer from non-trivial leakage inductance phenomena, which necessitate the need for affordable voltage snubber circuits to control the semiconductor switch peak drain-to-source voltages. Because of the price-sensitive nature of power converters, the snubber circuits are conventionally limited to the cost-effective passive and power lossy resistor-capacitor-diode (RCD) configurations.

SUMMARY

In some embodiments, a power converter includes an input side configured to receive an input voltage, and an output side configured to provide an output voltage. The power converter includes a main switch, a controller, a transformer having a primary winding that couples the main switch to the input side of the power converter, an active clamp switch, an active clamp capacitor that couples the active clamp switch to the input side of the power converter, the active clamp capacitor being coupled in a series circuit combination with the active clamp switch, and an active clamp controller circuit. The active clamp controller circuit includes a sampling circuit coupled to the main switch to receive a main switch voltage and configured to generate a sampled main switch voltage, a delay circuit coupled to the sampling circuit to receive the sampled main switch voltage and configured to generate a delayed sampled main switch voltage, a first voltage comparison circuit coupled to the sampling circuit to receive the sampled main switch voltage and coupled to the delay circuit to receive the delayed sampled main switch voltage, and an active clamp switch controller circuit. The active clamp switch controller circuit is configured to i) enable the active clamp switch based on a first comparison, by the first voltage comparison circuit, between the sampled main switch voltage and the delayed sampled main switch voltage, and ii) disable the active clamp switch based on a second comparison, by the first voltage comparison circuit, between the sampled main switch voltage and the delayed sampled main switch voltage.

In some embodiments, a method involves receiving, at an input side of a power converter, an input voltage, the input side of the power converter being coupled to a primary winding of a transformer of the power converter. A main switch of the power converter controls a current through the primary winding to generate an output voltage on an output side of the power converter. A sampling circuit of the power converter generates a sampled main switch voltage based on a main switch voltage of the main switch. A delay circuit of the power converter generates a delayed sampled main switch voltage based on the sampled main switch voltage. A first voltage comparison circuit of the power converter performs a first comparison of the sampled main switch voltage to the delayed sampled main switch voltage. An active clamp switch of the power converter is enabled, based on the first comparison, to clamp the main switch voltage to a maximum main switch voltage. The first voltage comparison circuit performs a second comparison of the sampled main switch voltage to the delayed sampled main switch voltage, and the active clamp switch is disabled based on the second comparison.

BRIEF DESCRIPTION OF THE DRAWINGS

FIG. 7-8 are portions of a process for clamping a voltage of a main switch of the power converter shown in FIG. 2 using the active clamp circuit shown in FIGS. 3-4, in accordance with some embodiments.

DETAILED DESCRIPTION

Figure 1:
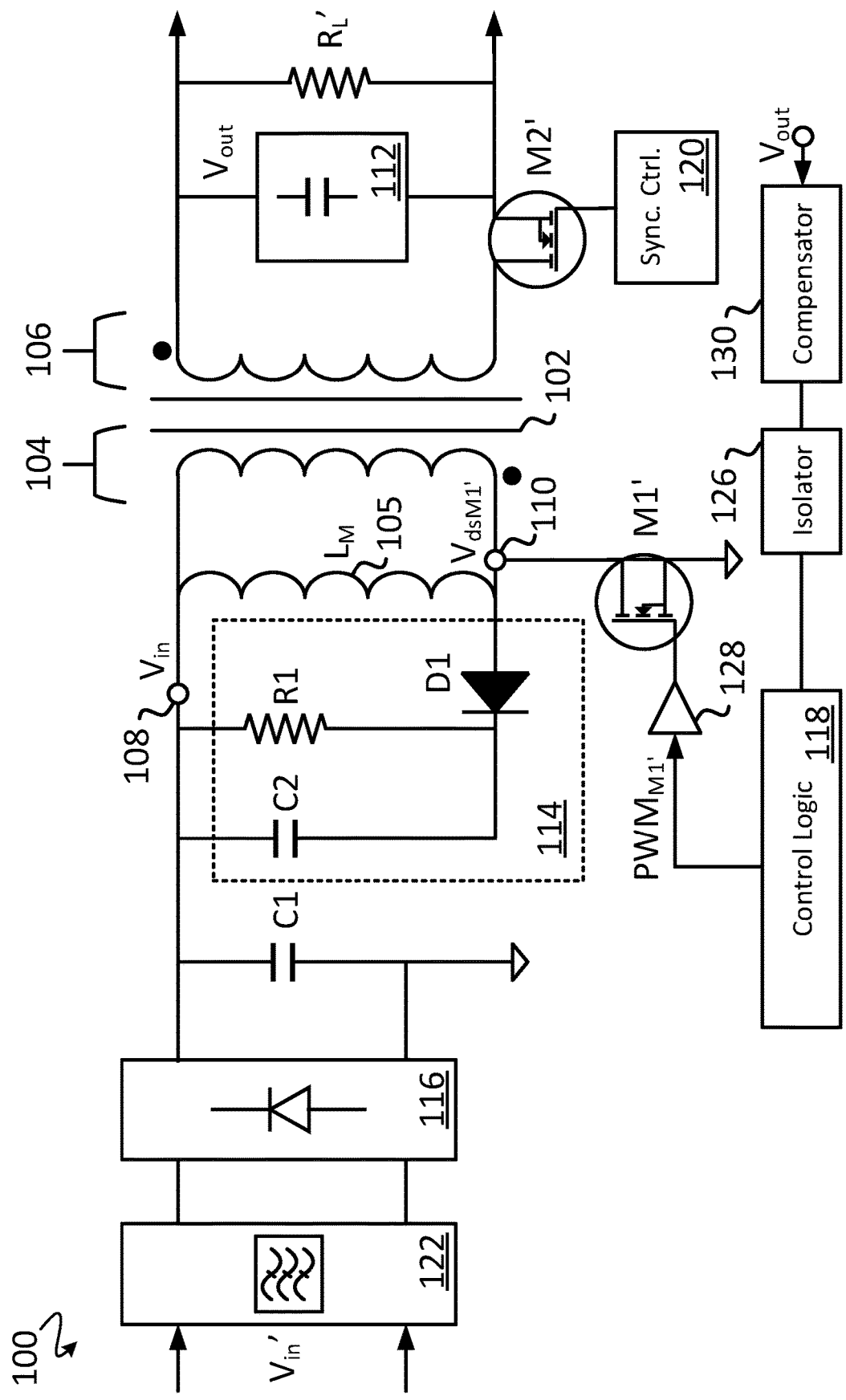
FIG. 1 is a simplified circuit schematic of a conventional power converter.

Some embodiments described herein provide a switch-mode power supply ("power converter") with an integrated active clamp circuit ("active clamp"). In such embodiments, the power converter converts an input voltage on a primary side of a transformer to an output voltage on a secondary side of the transformer by controlling a current through a primary winding of the transformer. The power converter controls the current through the primary winding using a primary side switch ("main switch").

Magnetically coupled elements of the power converter often suffer from non-trivial leakage inductance phenomena, which often necessitates the need for affordable voltage snubber circuits to control a peak drain-to-source voltage of the main switch. Because of the price-sensitive nature of power converters, such snubber circuits are conventionally limited to the cost-effective passive and power lossy resistor-capacitor-diode (RCD) configurations.

However, in power converters sensitive to power losses and heat generation, dissipation of power in lossy components in the form of heat is unsuitable. Thus, recycling of energy using an active clamping configuration within the power converter provides an opportunity for system form-factor reduction and power efficiency improvement. Additionally, clamping the maximum drain-source voltages of switching power transistors allows for increased device reliability of the switching power transistors. Furthermore, clamping the maximum drain-source voltages of switching power transistors allows for a reduction of the power converter reactive component size and cost.

The active clamp circuit, as compared to a resistor-capacitor-diode ("RCD") snubber circuit, advantageously increases power processing efficiency of the power converter by recycling energy stored in a leakage inductance of the transformer. In accordance with some embodiments, the active clamp circuit clamps a primary side peak voltage of a main switch of the power converter, which enables the power converter to utilize primary side and/or secondary side switches having a lower voltage rating, leading to reduced power losses during switch conduction and/or switching.

Additionally, the active clamp advantageously provides efficiency optimization for light-to-medium load (e.g., less than 30 percent of a maximum power of the power converter) and low-line input voltage (e.g., less than 140V rms) operating modes of the power converter, as compared to conventional active clamp circuits. Such efficiency optimization is achieved by only enabling the active clamp when a voltage across the main switch ("main switch voltage") is higher than a programmable value. In some embodiments, the programmable value is ten to twenty percent less than a maximum voltage rating of the main switch and is adjusted based on an input voltage of the power converter. Additionally, operation of the active clamp modulates a voltage across a capacitor ("active clamp capacitor") of the active clamp. Such modulation advantageously minimizes capacitance value variability with respect to voltage, thereby enabling a lower cost, ceramic capacitor, to be used as the active clamp capacitor as compared to a film capacitor.

Additionally, an on-time of the active clamp circuit can be advantageously reduced as compared to conventional active clamp solutions because the active clamp switching does not need to coincide with a main switch turn-on time. As a result, a smaller active clamp capacitor can be utilized as compared to that used in conventional clamping circuits because the active clamp circuit resonant period is shorter. Because the active clamp capacitor is a high voltage component, using a smaller capacitance can result in significant cost reduction benefits.

FIG. 1 is a simplified circuit schematic of a conventional power converter 100. Some elements of the power converter 100 have been omitted from FIG. 1 to simplify the description of power converter 100 but are understood to be present. In general, the power converter 100 includes an input side configured to receive an input voltage $V_{in}'$, and an output side configured to provide an output voltage $V_{out}$ from the input voltage, the input side being coupled to the output side by a transformer 102. The transformer 102 transfers power from the input side of the power converter 100 to the output side of the power converter 100 and generally includes a primary winding 104 and a secondary winding 106. The primary winding 104 includes a first winding node 108 and a second winding node 110. The input side of the power converter 100 generally includes an input voltage filter block 122, a rectifier block 116 (in the case of AC input), an input voltage buffer capacitor C1, a main switch M1', a gate driver circuit 128, a main switch control logic circuit ("controller") 118, and an RCD snubber circuit 114 that includes a capacitor C2, a resistor R1, and a diode D1. A magnetizing inductance $L_M$ of the transformer 102 is illustrated as a winding 105. The output side of the power converter 100 generally includes an output buffer circuit 112, a synchronous rectifier switch M2', a synchronous rectifier switch controller circuit ("Sync. Ctrl.") 120, and a load $R_L'$. A feedback path through a compensator circuit 130 and an isolator circuit 126 provides a measurement of the output voltage $V_{out}$ to the controller 118.

The voltage source $V_{in}'$ is received at the power converter 100. $V_{in}'$ can be provided either as an alternating current (AC) or direct current (DC). The main switch M1' is driven, via the gate driver circuit 128, by a pulse-width-modulation (PWM) signal $PWM_{M1'}$ generated by the controller 118. The input voltage filter block 122, rectifier block 116 and the input buffer capacitor C1 provide a filtered, buffered, rectified, or otherwise conditioned input voltage $V_{in}$ to the transformer 102. The transformer 102 transfers power from the input side of the power converter 100 to the output side of the power converter 100.

The first winding node 108 receives the input voltage $V_{in}$. The second winding node 110 is coupled to a drain node of the main switch M1'. The main switch M1' controls a current through the primary winding 104 to charge the magnetizing inductance $L_M$ 105 of the transformer 102 during a first portion of a switching cycle of the power converter 100. The synchronous rectifier switch M2' controls a current flow through the secondary winding 106 to discharge the transformer 102 into output buffer circuit 112 and the load $R_L'$ during a subsequent portion of the switching cycle.

To elaborate, when the main switch M1' is enabled by the controller 118 during the first portion of the switching cycle, current flows through the primary winding 104 to a voltage bias node such as ground. The current flow through the primary winding 104 causes energy to be stored in the magnetization inductance $L_M$ 105 and a leakage inductance $L_L$ (not shown) of the transformer 102. When the main switch M1' is disabled in the subsequent portion of the switching cycle, output voltage $V_{out}$ is generated at the output buffer circuit 112 and is provided to the load $R_L'$. When the main switch M1' is turned off, a reflected voltage ($nV_{out}$) is developed at a drain node of the main switch M1' at the second winding node 110. The contribution of the reflected voltage $nV_{out}$ to a drain-source voltage $V_{dsM1'}$ of the main switch M1' at the second winding node 110 is expressed as:

$$V_{dsM1'} = V_{in} + nV_{out} \quad \text{(Equation 1)}$$

where n is a turns ratio of the transformer 102. Energy stored in the leakage inductance $L_L$ of the transformer 102 also contributes to the voltage $V_{dsM1'}$ developed at the second winding node 110.

The RCD snubber circuit 114 prevents the voltage $V_{dsM1'}$ from increasing to a level that damages the main switch M1'. As $V_{dsM1'}$ rises, the diode D1 becomes forward biased and current flows into the capacitor C2 and into the resistor R1 to dissipate energy, thereby clamping $V_{dsM1'}$ to a level that is within a safe operating range of the main switch M1'. However, in systems sensitive to power losses and heat generation, the dissipation in lossy components (e.g., the resistor R1) in the form of heat is unsuitable.

Figure 2:
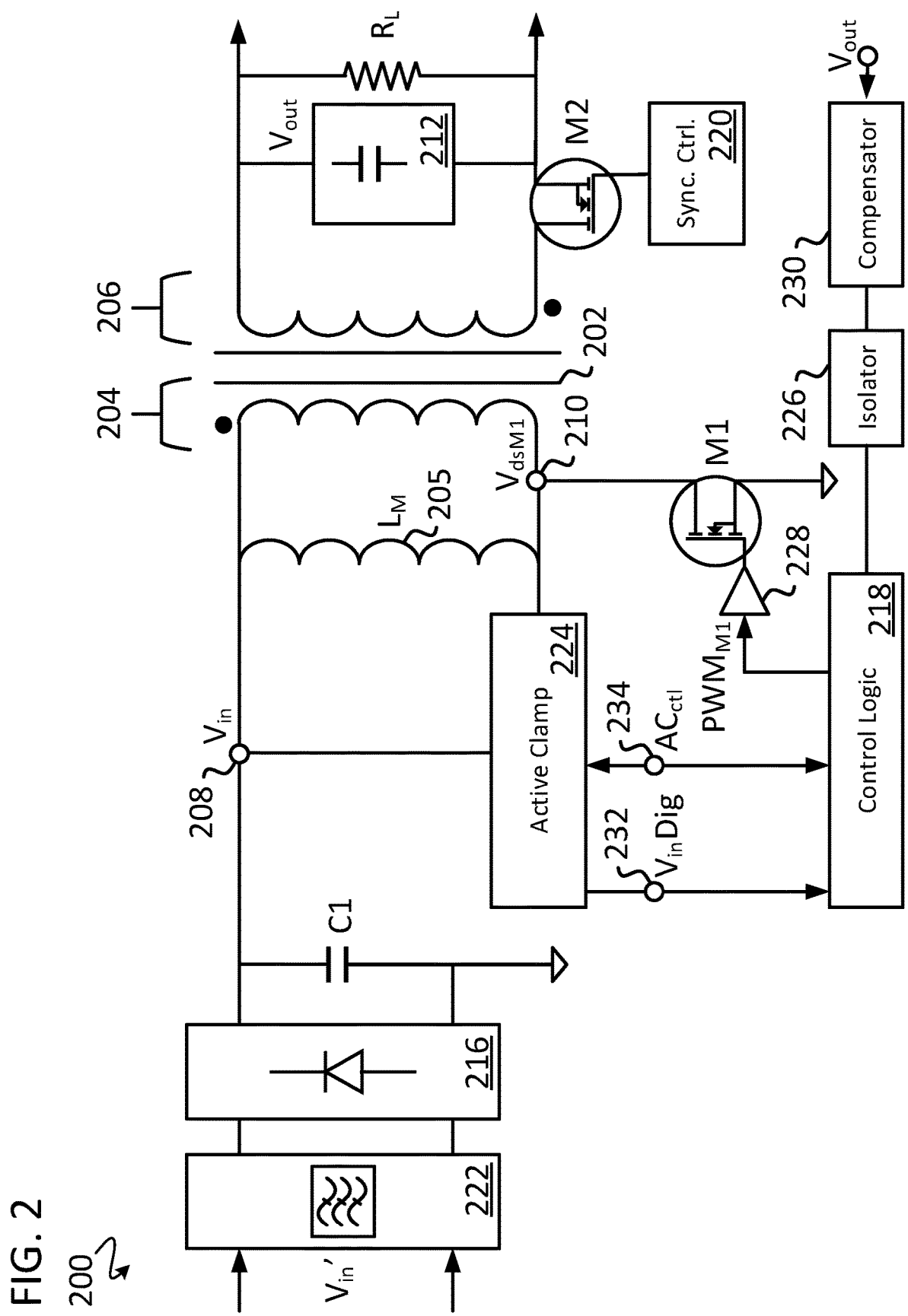
FIG. 2 is a simplified circuit schematic of a power converter with an active clamp, in accordance with some embodiments.

FIG. 2 is a simplified circuit schematic of a power converter 200 with an integrated active clamp circuit 224, in accordance with some embodiments. Some elements of the power converter 200 have been omitted from FIG. 2 to simplify the description of the power converter 200 but are understood to be present. Some elements of the power converter 200 are similar to elements of the power converter 100 (e.g., a main switch M1 is similar to the main switch M1'). However, in the embodiment shown the RCD snubber circuit 114 of the power converter 100 has been replaced with the integrated active clamp circuit ("active clamp circuit") 224.

In general, the power converter 200 includes an input side configured to receive an input voltage $V_{in}'$, and an output side configured to provide an output voltage $V_{out}$ using the input voltage. The input side is coupled to the output side by a transformer 202. The transformer 202 transfers power from the input side of the power converter 200 to the output side of the power converter 200 and generally includes a primary winding 204 and a secondary winding 206. The primary winding 204 includes a first winding node 208 and a second winding node 210. The input side of the power converter 200 generally includes an input filter block 222, a rectifier block 216 (in the case of AC input), an input voltage buffer capacitor C1, the main switch M1, a gate driver circuit 228, the active clamp circuit 224, and a main switch control logic circuit ("controller") 218. A magnetizing inductance $L_M$ of the transformer 202 is illustrated as a winding 205.

The output side of the power converter 200 generally includes an output buffer 212, a synchronous rectifier switch M2, a synchronous rectifier switch controller circuit ("Sync. Ctrl.") 220, and is configured to be connected to a load $R_L$. A feedback path through a compensator circuit 230 and an isolator circuit 226 provides a measurement of the output voltage $V_{out}$ to the controller 218. In some embodiments, one or both of the main switch M1 and/or the synchronous rectifier switch M2 are field-effect transistors (FETs), each having a drain node, a source node, and a gate node to control a conduction of current between the drain node and the source node. In other embodiments, the synchronous rectifier switch M2 is replaced with a diode.

Also shown are nodes 232 and 234. Signals exchanged between the active clamp circuit 224 and the controller 218 include a digital representation $V_{in}$Dig of the input voltage $V_{in}$ at the node 232 and aggregated (e.g., via a signal bus) active clamp signals $AC_{ctl}$ at the node 234. The main switch M1 is driven by a control signal $PWM_{M1}$, via the gate driver circuit 228, that is generated by the controller 218.

Similar to that which was described with reference to the first winding node 108 and the second winding node 110 of FIG. 1, the first winding node 208 receives an input voltage $V_{in}$ and the second winding node 210 receives a drain-source voltage ("main switch voltage") $V_{dsM1}$ of the main switch M1. As shown, the active clamp circuit 224 is connected between the first winding node 208 and the second winding node 210 and is communicatively coupled to the controller 218. The active clamp circuit 224 clamps (i.e., limits) the main switch voltage $V_{dsM1}$ to a voltage that is less than a maximum specified voltage of the main switch M1.

Figure 3:
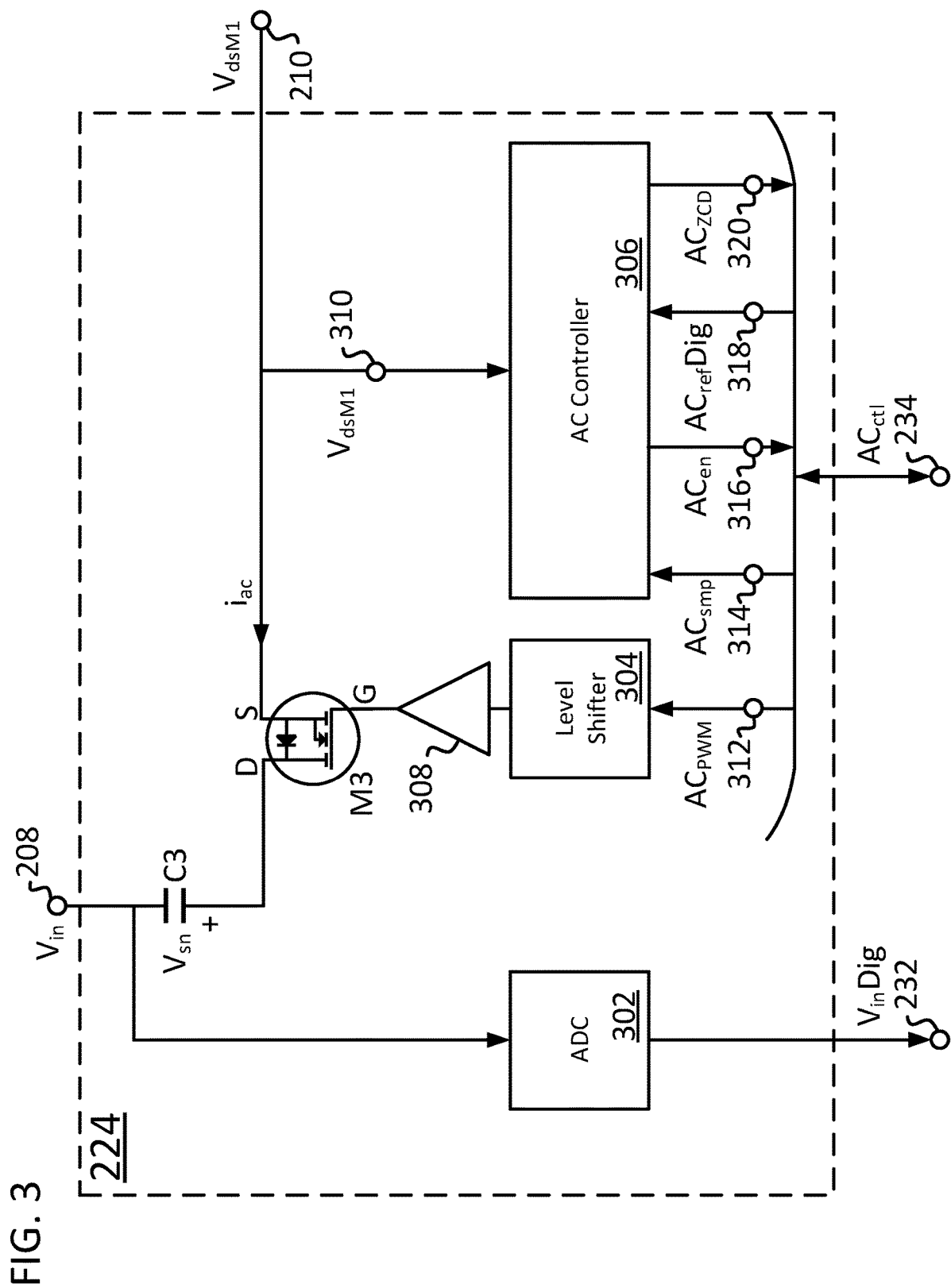
FIGS. 3-4 are simplified circuit schematics of portions of the power converter shown in FIG. 2, in accordance with some embodiments.

FIG. 3 is a simplified circuit schematic of the active clamp circuit 224 of the power converter 200, in accordance with some embodiments. Some elements of the active clamp circuit 224 have been omitted from FIG. 3 to simplify the description of the active clamp circuit 224 but are understood to be present. The active clamp circuit 224 generally includes an analog-to-digital converter circuit ("ADC") 302, a level shifter circuit 304, an active clamp controller circuit ("AC Controller") 306, a gate driver circuit 308, an active clamp capacitor C3, and an active clamp switch M3, coupled as shown. The active clamp switch M3 includes a body-diode, a drain node ('D'), a source node ('S'), and a gate node ('G') (i.e., a switch control node).

Also shown are nodes 312, 314, 316, 318, 320, and the nodes 208, 210, 232, and 234. In general, signals related to the operation of the active clamp circuit 224 include the input voltage $V_{in}$ at the first winding node 208, the main switch voltage $V_{dsM1}$ at the nodes 210, 310, an active clamp switch current $i_{ac}$ that flows through the active clamp switch M3, the digital representation $V_{in}$Dig of the input voltage at the node 232, an active clamp switch control signal $AC_{PWM}$ at the node 312, an active clamp sample signal $AC_{smp}$ at the node 314, an active clamp enable signal $AC_{en}$ at the node 316, a digital active clamp threshold voltage level $AC_{ref}$Dig at the node 318, a voltage $V_{sn}$ across the active clamp capacitor C3, and an active clamp switch zero current crossing detection signal $AC_{ZCD}$ at the node 320. The signals at 312, 314, 316, 318, and 320 are aggregated, for simplicity of discussion, into the active clamp signals $AC_{ctl}$ on the signal bus at the node 234.

The active clamp capacitor C3 is connected in a series circuit combination with the active clamp switch M3. The level shifter circuit 304 is coupled to the gate node G of the active clamp switch M3 through the gate driver circuit 308. The level shifter circuit 304 enables and disables the active clamp switch M3, via the gate driver circuit 308, based on an active clamp switch control signal $AC_{PWM}$ received from the controller 218 at the node 312.

The gate driver circuit 308 drives (i.e., enables and disables) the active clamp switch M3. In some embodiments, the active clamp switch M3 is a current-bidirectional two-quadrant switch. The gate node G of the active clamp switch M3 controls a conduction of current between the drain node D and the source node S. The drain node D and the source node S of the active clamp switch M3 are in a series circuit combination with the active clamp capacitor C3. In some embodiments, the active clamp switch M3 includes a diode, other than a body-diode, which is configured to pass a current between the source node S and the drain node D (in a first current direction) when the diode is forward biased (e.g., when sufficient voltage is developed across the source and drain of the active clamp switch M3). When the gate node G of the active clamp switch M3 is driven in response to the active clamp switch control signal $AC_{PWM}$, the active clamp switch M3 is enabled and passes current bidirectionally (e.g., in the first current direction, and/or a second current direction). In the first current direction, current flows from the primary winding 204, through the active clamp switch M3, and into the active clamp capacitor C3. In the second current direction, current flows from the active clamp capacitor C3, through the active clamp switch M3, and into the primary winding 204.

During a portion of a switching cycle of the power converter 200 when the main switch M1 and active clamp switch M3 are both off, the active clamp switch current $i_{ac}$ flows from the primary winding 204, through the body-diode of the active clamp switch M3, to the active clamp capacitor C3. During a subsequent portion of the switching cycle when the main switch M1 is off and the active clamp switch M3 is on, the current $i_{ac}$ oscillates between the active clamp capacitor C3, the magnetizing inductance $L_M$, and other intended or parasitic reactive elements of the power converter 200.

The ADC 302 is configured to receive the input voltage $V_{in}$ from the first winding node 208 and to generate the digital representation $V_{in}$Dig of the input voltage $V_{in}$. The active clamp controller circuit 306 is configured to receive the main switch voltage $V_{dsM1}$ from the node 310, receive the active clamp sample signal $AC_{smp}$ from the node 314, and receive the digital active clamp threshold voltage level $AC_{ref}$Dig from the node 318. Based on these signals received from the nodes 310, 314, and 318, the active clamp controller circuit 306 generates the active clamp enable signal $AC_{en}$ and the active clamp switch zero current crossing detection signal $AC_{ZCD}$. Based on the active clamp enable signal $AC_{en}$ and the active clamp switch zero current crossing detection signal $AC_{ZCD}$, the controller 218 generates the active clamp switch control signal $AC_{PWM}$, as will be discussed with reference to FIG. 4.

Figure 4:
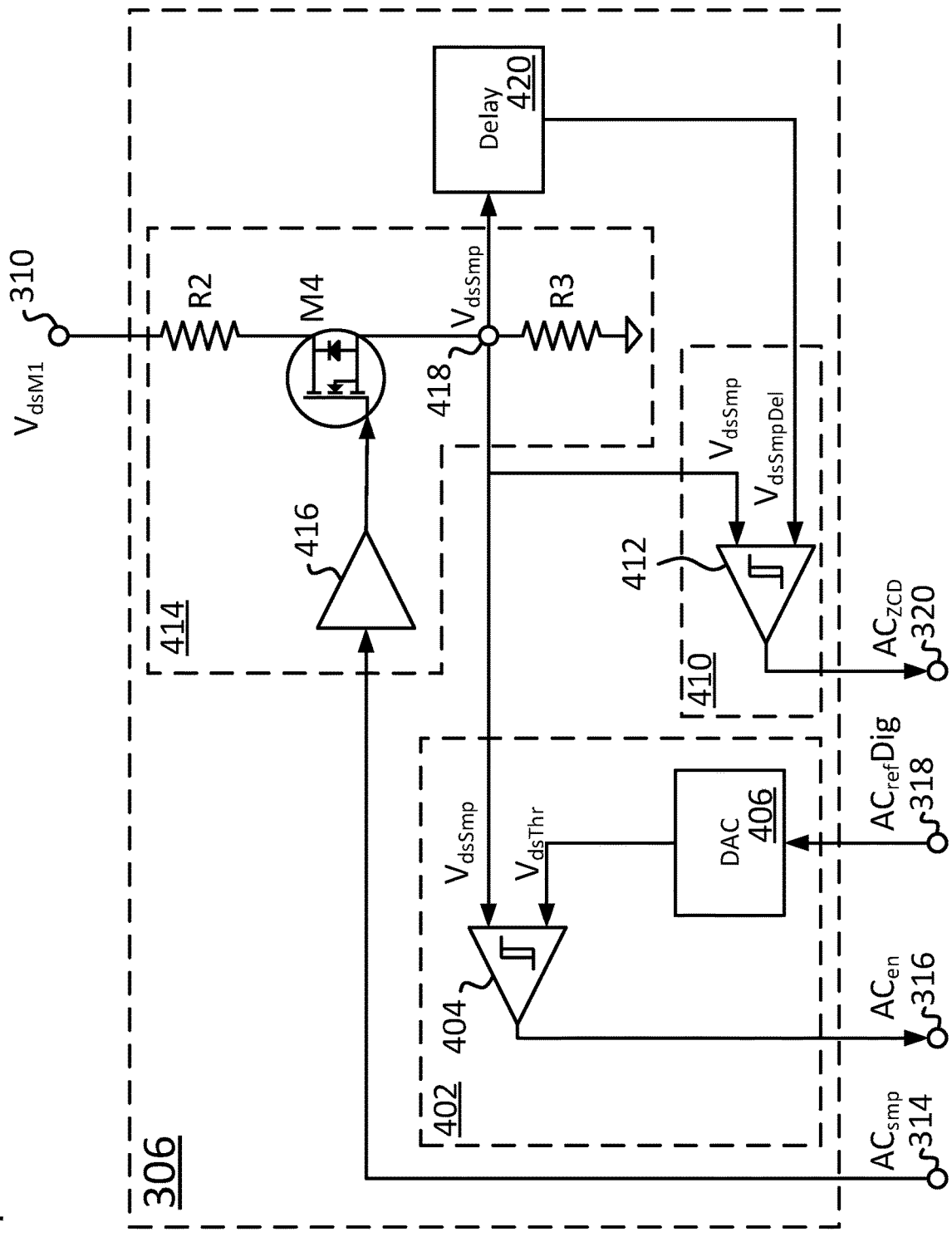

FIG. 4 is a simplified circuit schematic of the active clamp controller circuit 306 of the active clamp circuit 224, in accordance with some embodiments. Some elements of the active clamp controller circuit 306 have been omitted from FIG. 4 to simplify the description of the active clamp controller circuit 306 but are understood to be present. The active clamp controller circuit 306 generally includes an active clamp enable circuit 402, an active clamp switch controller circuit 410, a sampling circuit 414, and a delay circuit 420, coupled as shown. The active clamp enable circuit 402 generally includes a voltage comparison circuit 404 configured to have hysteresis, and a digital-to-analog converter circuit (DAC) 406. The active clamp switch controller circuit 410 generally includes a voltage comparison circuit 412 configured to have hysteresis. The sampling circuit 414 generally includes a gate driver circuit 416, a sampling switch M4, and a voltage-divider circuit R2, R3 (i.e., a voltage attenuation circuit). Also shown is a signal node 418.

In general, signals related to the operation of the active clamp controller circuit 306 include the main switch voltage $V_{dsM1}$ received by the sampling circuit 414 from the node 310, a sampled main switch voltage $V_{dsSmp}$ generated by the sampling circuit 414 at the node 418, a delayed sample main switch voltage signal $V_{dsSmpDel}$ generated by the delay circuit 420, the active clamp sample signal $AC_{smp}$ at the node 314, the active clamp enable signal $AC_{en}$ at the node 316, the digital active clamp threshold voltage level $AC_{ref}$Dig at the node 318, a threshold voltage $V_{dsThr}$ generated by the DAC 406, and the active clamp switch zero current crossing detection signal $AC_{ZCD}$ at the node 320. In some embodiments, the delay circuit 420 is configured to delay the sampled main switch voltage $V_{dsSmp}$ by an amount of time that is greater than a minimum conversion time of the voltage comparison circuit 412 and that is less than about a quarter of the period of a resonant frequency of the power converter 200. In some embodiments, the delay is less than one-eighth of the period of the resonant frequency of the power converter 200. For example, in some embodiments, the delay is greater than 100 ns and is less than about 160 ns.

Operation of the active clamp circuit 224 and the active clamp controller circuit 306, is described with reference to FIG. 5 and FIG. 6.

Figure 5:
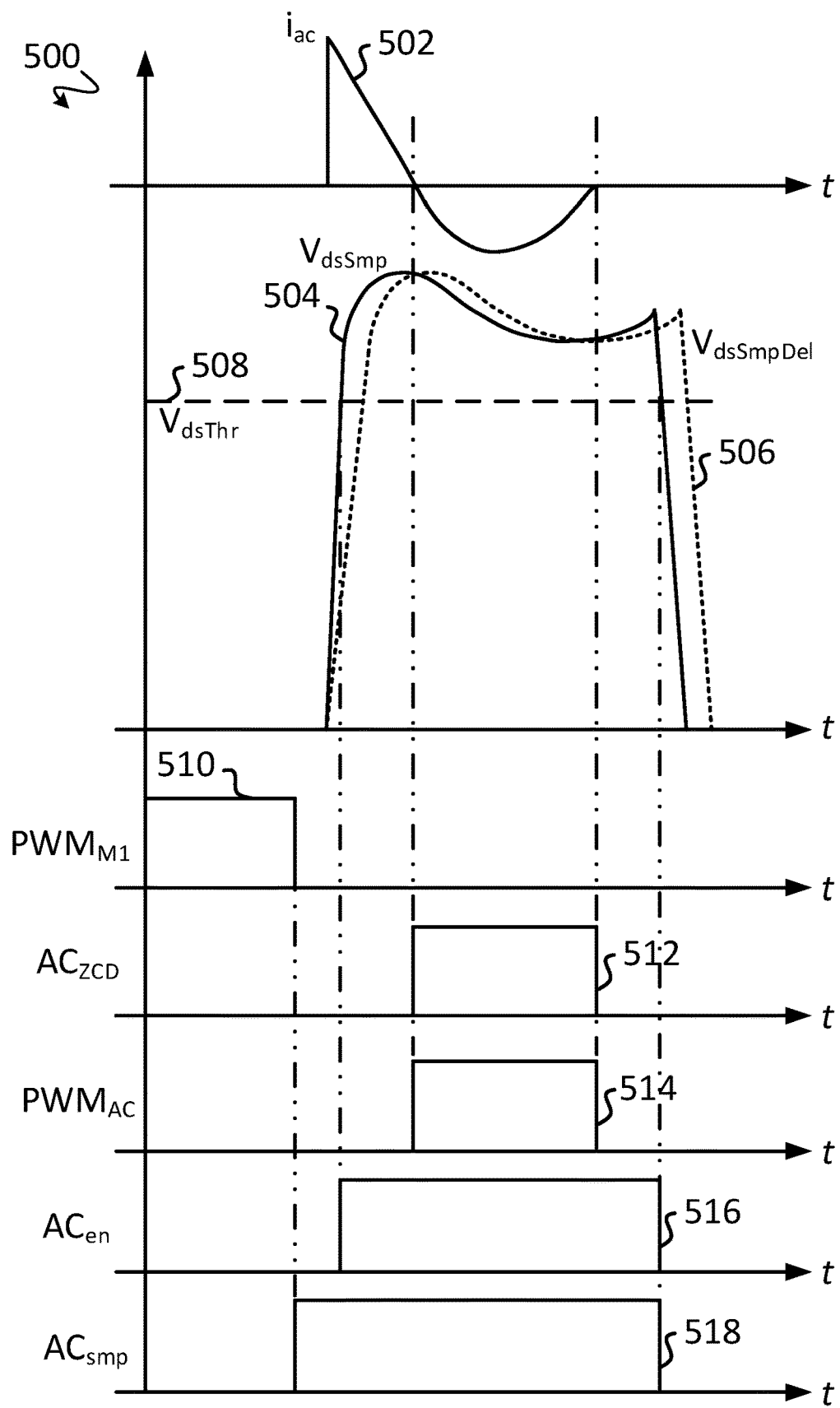
FIGS. 5-6 shows simplified plots of signals related to the power converter shown in FIGS. 2-4, in accordance with some embodiments.

FIG. 5 shows a simplified plot 500 of signals related to the power converter 200 shown in FIGS. 2-4, in accordance with some embodiments. The plot 500 includes a plot 502 of the active clamp switch current $i_{ac}$, a plot 504 of the sampled main switch voltage $V_{dsSmp}$, a plot 506 of the delayed sampled main switch voltage $V_{dsSmpDel}$, a plot 508 of the threshold voltage $V_{dsThr}$, a plot 510 of the main switch M1 control signal $PWM_{M1}$, a plot 512 of the active clamp switch zero current crossing detection signal $AC_{ZCD}$, a plot 514 of the active clamp switch M3 control signal $PWM_{AC}$, a plot 516 of the active clamp enable signal $AC_{en}$, and a plot 518 of the active clamp sample signal $AC_{smp}$.

Upon generating a falling edge of the main switch control signal $PWM_{M1}$ (510), the controller 218 transmits an asserted active clamp sample signal $AC_{smp}$ (518) to the gate driver circuit 416, thereby enabling the sampling switch M4 until the active clamp sample signal $AC_{smp}$ (518) is later de-asserted. In some embodiments, the active clamp sample signal $AC_{smp}$ (518) is later de-asserted by the controller 218 in response to the controller 218 receiving a de-asserted active clamp enable signal $AC_{en}$ (516). Thus, a sampling period of the sampling circuit 414 begins when the main switch M1 control signal $PWM_{M1}$ is de-asserted and expires when the active clamp enable signal $AC_{en}$ (516) is de-asserted (i.e., corresponding to a voltage level ($V_{dsThr}$) of the sampled main switch voltage signal ($V_{dsSmp}$)). During the time that the sampling switch M4 is enabled, the main switch voltage $V_{dsM1}$ is divided by the resistors R2, R3 to generate the sampled main switch voltage $V_{dsSmp}$ (504). Thus, advantageously, power from the main switch voltage $V_{dsM1}$ is only dissipated within the active clamp controller circuit 306 when the sampling switch M4 is enabled, thereby increasing a power efficiency of the active clamp controller circuit 306 as compared to a power efficiency of a conventional active clamp circuit. During the time that the sampling switch M4 is enabled, the sampled main switch voltage $V_{dsSmp}$ (504) is received at a first terminal of the voltage comparison circuit 404 of the active clamp enable circuit 402. Additionally, the threshold voltage $V_{dsThr}$ (508) is received at a second terminal of the voltage comparison circuit 404. If the sampled main switch voltage $V_{dsSmp}$ (504) is greater than or equal to the threshold voltage $V_{dsThr}$ (508), the voltage comparison circuit 404 transmits an asserted active clamp enable signal $AC_{en}$ (516) to the controller 218. In some embodiments, the threshold voltage $V_{dsThr}$ represents a voltage level that is within a threshold range (e.g., 10 percent to 20 percent) of a maximum safe operating voltage of the main switch M1 and is further adjusted based on the input voltage $V_{in}$ of the power converter 200. The sampled main switch voltage $V_{dsSmp}$ (504) is also received at the delay circuit 420 which generates the delayed sampled main switch voltage $V_{dsSmpDel}$ (506). The sampled main switch voltage $V_{dsSmp}$ (504) is received at a first terminal of the voltage comparison circuit 412 of the active clamp switch enable circuit 410, and the delayed sampled main switch voltage $V_{dsSmpDel}$ 506 is received at a second terminal of the voltage comparison circuit 412. When the delayed sampled main switch voltage $V_{dsSmpDel}$ (506) is greater than or equal to the sampled main switch voltage $V_{dsSmp}$ (504), the voltage comparison circuit 412 generates an asserted active clamp zero crossing detection signal $AC_{ZCD}$ (512) (i.e., representing a zero crossing of the active clamp switch current $i_{ac}$ (502)).

Upon receiving the asserted active clamp zero crossing detection signal $AC_{ZCD}$ (512), the controller 218 generates an asserted active clamp switch M3 control signal $PWM_{AC}$ if the active clamp enable signal $AC_{en}$ (516) is asserted. If the active clamp enable signal $AC_{en}$ (516) is not asserted, the controller 218 does not generate an asserted active clamp switch M3 control signal $PWM_{AC}$, irrespective of the comparison of the delayed sampled main switch voltage $V_{dsSmpDel}$ to the delayed sampled main switch voltage $V_{dsSmp}$.

When an asserted active clamp switch M3 control signal $PWM_{AC}$ (514) is received at the level shifter circuit 304, the active clamp switch M3 is enabled by the level shifter 304 using the gate driver circuit 308. When the delayed sampled main switch voltage $V_{dsSmpDel}$ (506) is no longer greater than or equal to the sampled main switch voltage $V_{dsSmp}$ (504), the active clamp zero crossing detection signal $AC_{ZCD}$ (512) is de-asserted. Upon receiving the de-asserted active clamp zero crossing detection signal $AC_{ZCD}$ (512), the controller 218 de-asserts the active clamp switch M3 control signal $PWM_{AC}$ (514). The de-asserted active clamp switch M3 control signal $PWM_{AC}$ (514) is received at the level shifter circuit 304, which disables the active clamp switch M3 using the gate driver circuit 308.

When the sampled main switch voltage $V_{dsSmp}$ (504) drops to a voltage level that is no longer greater than or equal to the threshold voltage $V_{dsThr}$ (508), the voltage comparison circuit 404 of the active clamp enable circuit 402 transmits a de-asserted active clamp enable signal $AC_{en}$ (516) to the controller 218. As previously described, upon receiving the de-asserted active clamp enable signal $AC_{en}$ (516), the controller 218 will not transmit an asserted active clamp switch M3 control signal $PWM_{AC}$ (514), irrespective of a comparison between the delayed sampled main switch voltage $V_{dsSmpDel}$ (506) and the sampled main switch voltage $V_{dsSmp}$ (504). Thus, advantageously, the active clamp switch M3 is not enabled for light-to-medium load operation of the power converter 200.

Figure 6:
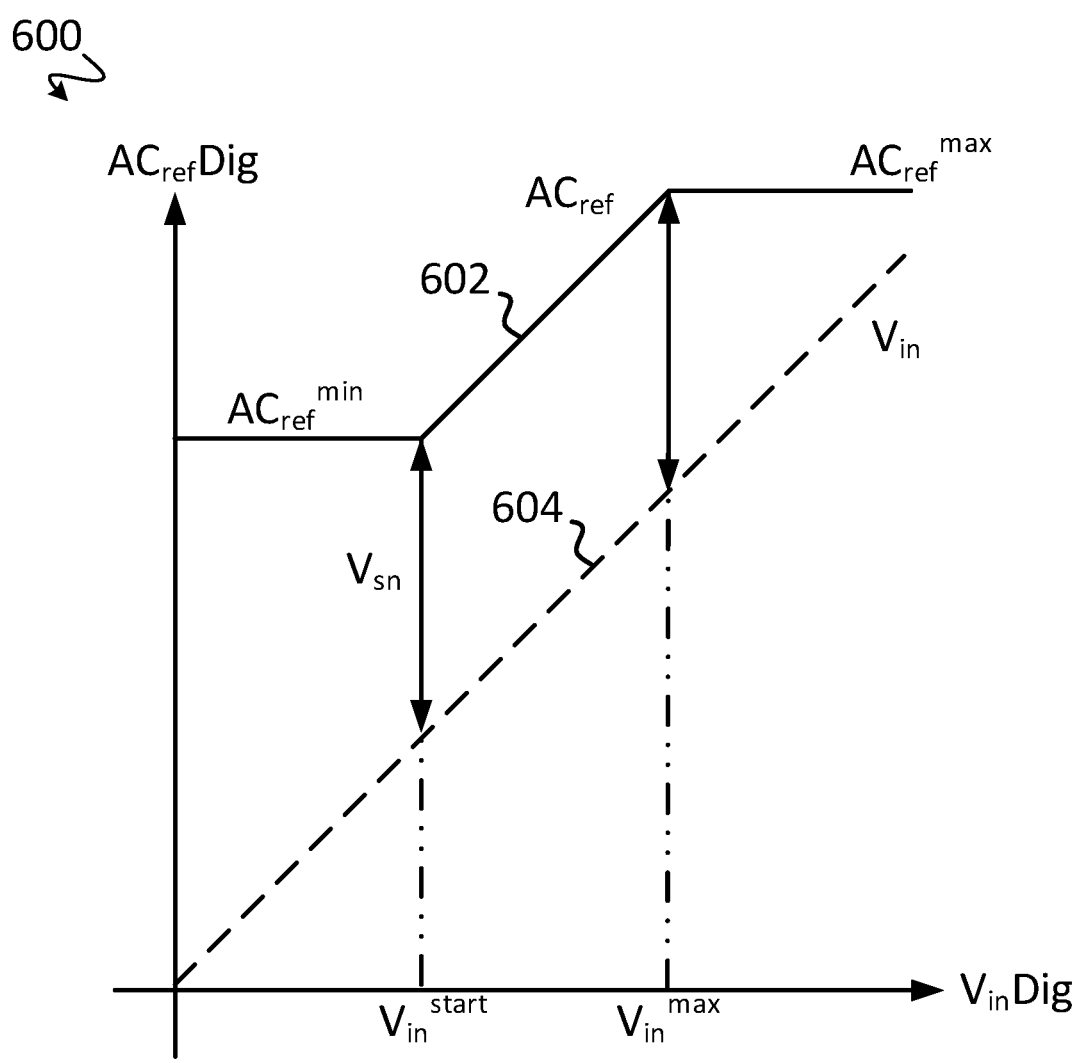

FIG. 6 shows a simplified plot 600 of signals related to the power converter 200 shown in FIGS. 2-4, in accordance with some embodiments. The plot 600 includes a plot 602 of the active clamp threshold voltage level $AC_{ref}$, and a plot 604 of the input voltage $V_{in}$ of the power converter 200. The digital active clamp threshold voltage level $AC_{ref}Dig$ is generated by the controller 218 based on the digital representation $V_{in}Dig$ (generated by the ADC 302) of the input voltage $V_{in}$ in accordance with a piecewise function. The active clamp threshold level $AC_{ref}$ is then generated by the DAC 406 using the digital active clamp threshold voltage level $AC_{ref}Dig$. As shown, in a first region of the piecewise function, $AC_{ref}$ (and therefore $AC_{ref}Dig$) is equal to a minimum level $AC_{ref}^{min}$ until $V_{in}$ (and therefore $V_{in}Dig$) reaches a level corresponding to $V_{in}^{start}$. In a second region of the piecewise function, after $V_{in}$ surpasses $V_{in}^{start}$, $AC_{ref}$ corresponds linearly to $V_{in}$ until $V_{in}$ reaches a level corresponding to $V_{in}^{max}$. In some embodiments, a slope of $AC_{ref}$ in the second region of the piecewise function is equal to a slope of $V_{in}$ until $V_{in}$ reaches the level corresponding to $V_{in}^{max}$. In some embodiments, $AC_{ref}$ is offset from $V_{in}$ by a fixed value (e.g., 0, $V_{sn}$, or another value). In a third region of the piecewise function, after $V_{in}$ surpasses $V_{in}^{max}$, $AC_{ref}$ is equal to a maximum level $AC_{ref}^{max}$. Thus, the voltage level at which the active clamp circuit 224 is enabled (i.e., by an asserted $AC_{en}$ signal) advantageously adapts as a function of the input voltage $V_{in}$.

Example criteria for determining voltage levels of $V_{in}^{start}$, $V_{in}^{max}$, $AC_{ref}^{min}$, and $AC_{ref}^{max}$ include i) a maximum voltage rating of the active clamp capacitor C3, ii) a maximum voltage rating of the main switch M1, and iii) efficiency of the converter 200. Regarding example criteria (i), in some embodiments, $AC_{ref}^{min}$ and $AC_{ref}^{max}$ are selected such that the active clamp circuit 224 is enabled based on the input voltage $V_{in}$ and the voltage $V_{sn}$ across the active clamp capacitor C3. In such embodiments, for example, the active clamp circuit 224 is enabled when the voltage $V_{sn}$ across the active clamp capacitor C3 is within a threshold value of the maximum voltage rating of the active clamp capacitor C3. Regarding example criteria (ii), in some embodiments, $AC_{ref}^{min}$ and $AC_{ref}^{max}$ are selected such that the active clamp circuit 224 is enabled when the voltage $V_{dsM1}$ across the main switch M1 is within a threshold value of the maximum voltage rating of the main switch M1. Regarding example criteria (iii), in some embodiments, $AC_{ref}^{min}$ and $AC_{ref}^{max}$ are selected such that the active clamp circuit 224 is not enabled when the input voltage $V_{in}$ is below a threshold value (e.g., $V_{in}^{start}$). In some embodiments, $V_{in}^{start}$ is about 300-400V, $V_{sn}$ is about 100-200V, and $V_{in}^{max}$ is about 450-550V.

The threshold voltage $V_{dsThr}$ is generated by the DAC 406 in response to the digital active clamp threshold voltage level $AC_{ref}Dig$. Thus, in some embodiments, the portions of the controller 218 acting in conjunction with the DAC 406 to generate $V_{dsThr}$ is considered to be a "threshold voltage generator circuit".

FIG. 7 is a portion of an example process 700 for clamping a voltage of a main switch (M1) of a power converter (200), in accordance with some embodiments. The particular steps, order of steps, and the combination of steps are shown for illustrative and explanatory purposes only. Other embodiments can implement different particular steps, orders of steps, and combinations of steps to achieve similar functions or results. In some embodiments, all or a portion of the steps of the process 700 are performed by the power converter 200, and in particular, the controller 218 and the active clamp circuit 224. At step 702, an input voltage $V_{in}$ is received at a primary winding (204) of a transformer (202) of the power converter (200). At step 704, a current through the primary winding (204) is controlled using a main switch (M1) of the power converter (200). At step 706, a voltage $V_{dsSmp}$ is generated by sampling (e.g., by the sampling circuit 414) a voltage $V_{dsM1}$ of the main switch (M1). At step 708, a threshold voltage $V_{dsThr}$ is generated (e.g., by the controller 218 and the DAC 406) by sampling the input voltage $V_{in}$ (e.g., by the ADC 302). At step 710, the voltage $V_{dsSmp}$ is compared to the threshold voltage $V_{dsThr}$. At step 712, it is determined whether the voltage $V_{dsSmp}$ is greater than or equal to the threshold voltage $V_{dsThr}$. If it is determined at step 712 that the voltage $V_{dsSmp}$ is not greater than or equal to the threshold voltage $V_{dsThr}$, flow of the process 700 returns to step 710. If it is determined at step 712 that the voltage $V_{dsSmp}$ is greater than or equal to the threshold voltage $V_{dsThr}$, flow of the process 700 continues to step 714. At step 714, the main switch voltage $V_{dsM1}$ is clamped to a maximum voltage using an active clamp switch (M3) of an active clamp circuit (224) of the power converter (200) and based on a comparison of the voltage $V_{dsSmp}$ to a delayed sampled main switch voltage $V_{dsSmpDel}$.

Figure 8:
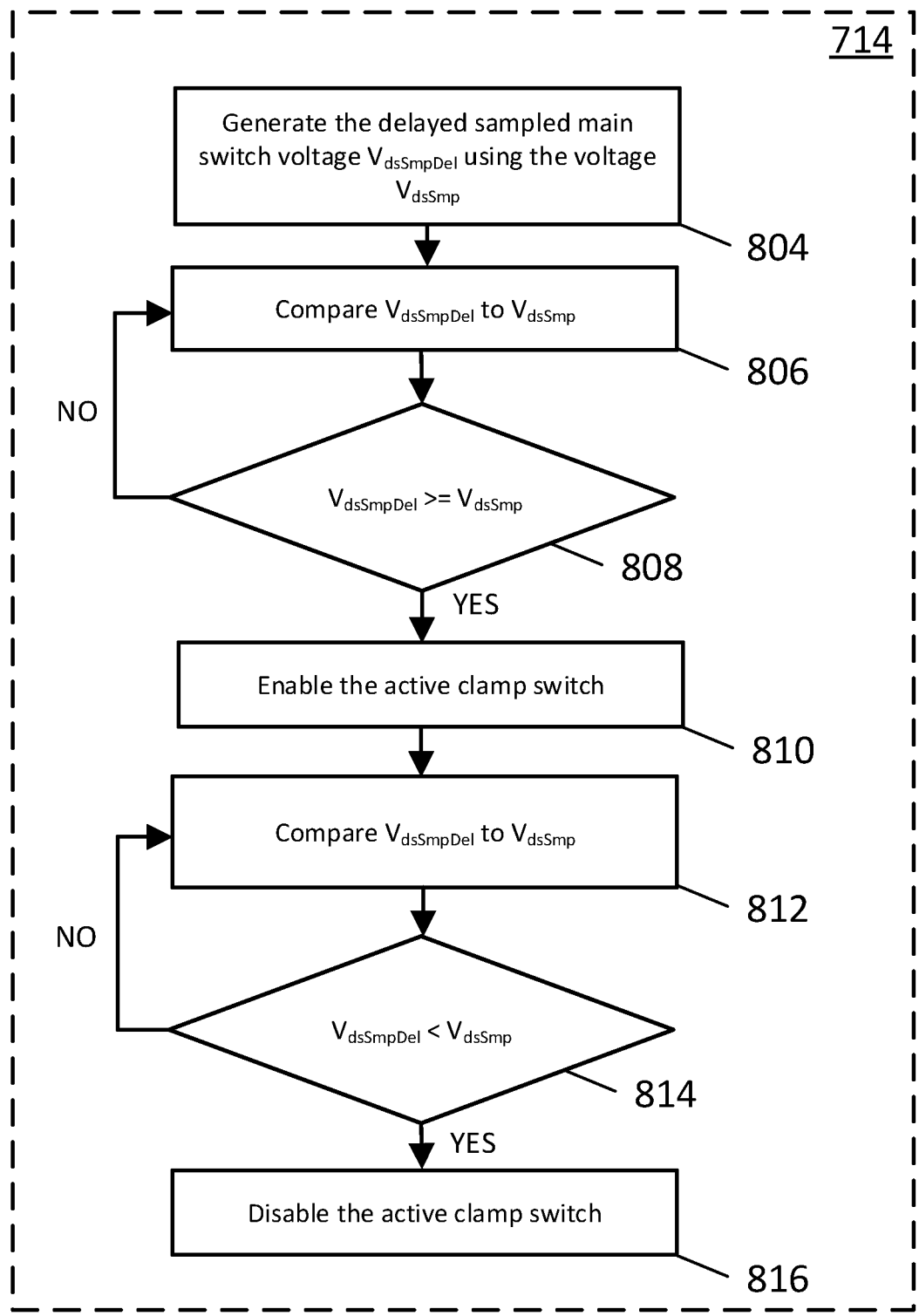

Details of step 714 are presented in FIG. 8, in accordance with some embodiments. The particular steps, order of steps, and the combination of steps are shown for illustrative and explanatory purposes only. Other embodiments can implement different particular steps, orders of steps, and combinations of steps to achieve similar functions or results.

At step 804, the delayed sampled main switch voltage $V_{dsSmpDel}$ is generated (e.g., by the delay circuit 420) using the voltage $V_{dsSmp}$. At step 806, the voltage $V_{dsSmpDel}$ is compared to the voltage $V_{dsSmp}$. At step 808, it is determined if the voltage $V_{dsSmpDel}$ is greater than or equal to the voltage $V_{dsSmp}$. If it is determined at step 808 that the voltage $V_{dsSmpDel}$ is not greater than or equal to the voltage $V_{dsSmp}$, flow of the process 700 returns to step 806. If it is determined at step 808 that the voltage $V_{dsSmpDel}$ is greater than or equal to the voltage $V_{dsSmp}$, flow of the process 700 continues to step 810. At step 810, the active clamp switch (M3) is enabled (e.g., by an asserted $PWM_{AC}$ signal).

At step 812, the voltage $V_{dsSmpDel}$ is compared to the voltage $V_{dsSmp}$. At step 814, it is determined if the voltage $V_{dsSmpDel}$ is less than the voltage $V_{dsSmp}$. If it is determined at step 814 that the voltage $V_{dsSmpDel}$ is not less than the voltage $V_{dsSmp}$, flow of the process 700 returns to step 812. If it is determined at step 814 that the voltage $V_{dsSmpDel}$ is less than the voltage $V_{dsSmp}$, flow of the process 700 continues to step 816. At step 816, the active clamp switch (M3) is disabled (e.g., by a de-asserted $PWM_{AC}$ signal).

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. An active clamp controller circuit comprising:
   a sampling circuit configured to receive a main switch voltage from a main switch of a power converter and configured to generate a sampled main switch voltage based on the main switch voltage;
   a delay circuit coupled to the sampling circuit to receive the sampled main switch voltage and configured to generate a delayed sampled main switch voltage;
   a first voltage comparison circuit coupled to the sampling circuit to receive the sampled main switch voltage and coupled to the delay circuit to receive the delayed sampled main switch voltage; and
   an active clamp switch controller circuit that includes the first voltage comparison circuit, the active clamp switch controller circuit being configured to i) enable an active clamp switch of the power converter based on a first comparison, by the first voltage comparison circuit, between the sampled main switch voltage and the delayed sampled main switch voltage, and ii) disable the active clamp switch based on a second comparison, by the first voltage comparison circuit, between the sampled main switch voltage and the delayed sampled main switch voltage.

2. The active clamp controller circuit of claim 1, further comprising:
   an active clamp enable circuit, the active clamp enable circuit being configured to disable the active clamp switch based on the sampled main switch voltage, irrespective of the first comparison and the second comparison.

3. The active clamp controller circuit of claim 2, wherein:
   the active clamp enable circuit is configured to disable the active clamp switch if the sampled main switch voltage is less than a threshold voltage that is within a threshold voltage range from a maximum voltage rating of the main switch.

4. The active clamp controller circuit of claim 3, wherein: the threshold voltage range is about 10 percent.

5. The active clamp controller circuit of claim 3, wherein: the threshold voltage range is about 20 percent.

6. The active clamp controller circuit of claim 2, wherein:
   the active clamp enable circuit is configured to disable the active clamp switch based on a third comparison between the sampled main switch voltage and a threshold voltage.

7. The active clamp controller circuit of claim 6, wherein: the threshold voltage is produced in accordance with a piecewise function.

8. The active clamp controller circuit of claim 6, wherein the active clamp enable circuit comprises:
   a threshold voltage generator circuit to generate the threshold voltage; and
   a second voltage comparison circuit coupled to the sampling circuit to receive the sampled main switch voltage and coupled to the threshold voltage generator circuit to receive the threshold voltage, the second voltage comparison circuit being configured to disable the active clamp switch if the sampled main switch voltage is less than the threshold voltage.

9. The active clamp controller circuit of claim 1, wherein the sampling circuit comprises:
   a sampling switch to receive the main switch voltage; and
   a voltage attenuation circuit coupled to the sampling switch,
   wherein:
   the sampling switch is configured to pass the main switch voltage to the voltage attenuation circuit when the sampling switch is enabled; and
   the voltage attenuation circuit is configured to generate the sampled main switch voltage based on the main switch voltage.

10. The active clamp controller circuit of claim 9, wherein:
    the sampling switch is enabled for a sampling period, a beginning of the sampling period corresponding to the main switch being disabled, and an expiration of the sampling period corresponding to a voltage level of the sampled main switch voltage, the sampling switch being disabled at the expiration of the sampling period.

11. An active clamp circuit comprising:
    an active clamp switch configured to be coupled to a main switch of a power converter;
    an active clamp capacitor coupled in a series circuit combination with the active clamp switch; and
    an active clamp controller circuit coupled to the active clamp switch, the active clamp controller circuit comprising:
    a sampling circuit configured to receive a main switch voltage from the main switch of the power converter and configured to generate a sampled main switch voltage;
    a delay circuit coupled to the sampling circuit to receive the sampled main switch voltage and configured to generate a delayed sampled main switch voltage;
    a first voltage comparison circuit coupled to the sampling circuit to receive the sampled main switch voltage and coupled to the delay circuit to receive the delayed sampled main switch voltage; and
    an active clamp switch controller circuit that includes the first voltage comparison circuit, the active clamp switch controller circuit being configured to i) enable the active clamp switch based on a first comparison, by the first voltage comparison circuit, between the sampled main switch voltage and the delayed sampled main switch voltage, and ii) disable the active clamp switch based on a second comparison, by the first voltage comparison circuit, between the sampled main switch voltage and the delayed sampled main switch voltage.

12. The active clamp circuit of claim 11, wherein the active clamp controller circuit further comprises:
    an active clamp enable circuit, the active clamp enable circuit being configured to disable the active clamp switch based on the sampled main switch voltage, irrespective of the first comparison and the second comparison.

13. The active clamp circuit of claim 12, wherein:
the active clamp enable circuit is configured to disable the active clamp switch if the sampled main switch voltage is less than a threshold voltage that is within a threshold voltage range from a maximum voltage rating of the main switch.

14. The active clamp circuit of claim 13, wherein:
the threshold voltage range is about 10 percent.

15. The active clamp circuit of claim 13, wherein:
the threshold voltage range is about 20 percent.

16. The active clamp circuit of claim 12, wherein:
the active clamp enable circuit is configured to disable the active clamp switch based on a third comparison between the sampled main switch voltage and a threshold voltage.

17. The active clamp circuit of claim 16, wherein:
the threshold voltage is produced in accordance with a piecewise function.

18. The active clamp circuit of claim 16, wherein the active clamp enable circuit comprises:
a threshold voltage generator circuit to generate the threshold voltage; and
a second voltage comparison circuit coupled to the sampling circuit to receive the sampled main switch voltage and coupled to the threshold voltage generator circuit to receive the threshold voltage, the second voltage comparison circuit being configured to disable the active clamp switch if the sampled main switch voltage is less than the threshold voltage.

19. The active clamp circuit of claim 11, wherein the sampling circuit comprises:
a sampling switch to receive the main switch voltage; and
a voltage attenuation circuit coupled to the sampling switch,
wherein:
the sampling switch is configured to pass the main switch voltage to the voltage attenuation circuit when the sampling switch is enabled; and
the voltage attenuation circuit is configured to generate the sampled main switch voltage based on the main switch voltage.

20. The active clamp circuit of claim 19, wherein:
the sampling switch is enabled for a sampling period, a beginning of the sampling period corresponding to the main switch being disabled, and an expiration of the sampling period corresponding to a voltage level of the sampled main switch voltage, the sampling switch being disabled at the expiration of the sampling period.

* * * * *